(12) United States Patent
Wei et al.

(10) Patent No.: US 7,460,678 B2
(45) Date of Patent: Dec. 2, 2008

(54) DIGITAL AUDIO PROCESSOR

(75) Inventors: Bin Wei, Guangzhou (CN); Shuang Ming Liu, Guangzhou (CN)

(73) Assignee: Thomson Licensing, Boulogne-Billancourt (FR)

( * ) Notice: Subject to any disclaimer, the term of this patent is extended or adjusted under 35 U.S.C. 154(b) by 580 days.

(21) Appl. No.: 10/467,815

(22) PCT Filed: Feb. 4, 2002

(86) PCT No.: PCT/EP02/01104

§ 371 (c)(1),
(2), (4) Date: Aug. 12, 2003

(87) PCT Pub. No.: WO02/080358

PCT Pub. Date: Oct. 10, 2002

(65) Prior Publication Data

US 2004/0068402 A1  Apr. 8, 2004

(30) Foreign Application Priority Data

Feb. 14, 2001  (EP) .................................. 01400387

(51) Int. Cl.
*H03G 5/00* (2006.01)
(52) U.S. Cl. .................... 381/98; 381/103; 381/107; 381/102
(58) Field of Classification Search ................ 381/104, 381/101, 102, 107, 98, 103, 106, 61, 1; 700/94
See application file for complete search history.

(56) References Cited

U.S. PATENT DOCUMENTS

| | | | | |
|---|---|---|---|---|
| 3,557,309 A | * | 1/1971 | Graham | 381/107 |
| 5,018,205 A | * | 5/1991 | Takagi et al. | 381/86 |
| 5,524,022 A | | 6/1996 | Kihara et al. | 375/229 |
| 5,557,237 A | * | 9/1996 | Carpentier | 330/129 |
| 5,872,852 A | * | 2/1999 | Dougherty | 381/57 |
| 7,031,474 B1 | * | 4/2006 | Yuen et al. | 381/1 |

FOREIGN PATENT DOCUMENTS

| | | |
|---|---|---|
| JP | 6-013826 | 1/1994 |
| JP | 9-232896 | 9/1997 |

OTHER PUBLICATIONS

Patent Abstracts of Japan, vol. 018, No. 213, Apr. 15, 1994 & JP 6-013826.
Patent Abstracts of Japan, vol. 1998, No. 1, Jan. 30, 1998 & JP 9-232896.
Search Report dated Apr. 8, 2003.

* cited by examiner

*Primary Examiner*—Vivian Chin
*Assistant Examiner*—Jason Kurr
(74) *Attorney, Agent, or Firm*—Joseph J. Laks; Robert D. Shedd; Brian J. Cromarty

(57) ABSTRACT

The present invention is related to a method for adjusting the frequency characteristic of a digital audio processor having adjustable parameters including at least low frequency gain, high frequency gain and volume gain. The invention is also related to an audio device executing the inventive method every time the characteristic frequency response curve is adjusted. Today's audio devices frequently offer the feature that the user can select among a group of different sound characteristics. Typically the user may want to adapt the sound characteristic of the device to the kind of music he is listening, e.g. rock, jazz, or classic music. In technical terms the sound characteristic is widely determined by the characteristic frequency response curve of the audio signal processing. Those characteristic curves are essentially defined by a gain value in the low, middle and high frequency range. Normally, a 3-band audio processor, which allows adjusting these three parameters independently is used for this purpose. However, 3-band audio processors are relatively more expensive than 2-band audio processors, which allows only adjusting the gain value at the low frequency range and high frequency range. The invention suggests a method how to adjust the volume gain, the low and high frequency gain of a 2-band audio processor to achieve the same features a 3-band audio processor offers.

9 Claims, 4 Drawing Sheets

DIGITAL AUDIO PROCESSOR

This application claims the benefit, under 35 U.S.C. § 365 of International Application PCT/EP02/01104, filed Feb. 4, 2002, which was published in accordance with PCT Article 21(2) on Oct. 10, 2002 in English and which claims the benefit of European patent application No. 01400387.5, filed Feb. 14, 2001.

The present invention is related to a method for adjusting the frequency characteristic of a digital audio processor having adjustable parameters including at least low frequency gain, high frequency gain and volume gain.

Today's audio devices frequently offer the feature that a user can select among a group of different sound characteristics. Typically the user may want to adapt the sound characteristic of the device to the kind of music he is listening, e.g. rock, jazz, or classic music. In technical terms the sound characteristic is mainly determined by the characteristic frequency response curve of the audio signal processing. Those characteristic curves are essentially defined by a gain value at the low, middle and high frequency range. Normally, a 3-band audio processor, which allows adjusting these three parameters independently, is used for this purpose. However, 3-band audio processors are relatively more expensive than 2-band audio processors, which allows only adjusting the gain value at the low frequency range and high frequency range.

It is therefore desirable to provide a method for adjusting the frequency characteristic of a digital audio processor, wherein the method permits to realize all frequency characteristic curves achievable with a 3-band audio processors but requiring only a 2-band audio processor.

The invention provides a method for adjusting the frequency characteristic of a digital audio processor having adjustable parameters including at least a low frequency gain, a high frequency gain and a volume gain, wherein the method comprises the steps of:

a) selecting a frequency characteristic curve having attributed a low frequency gain, a middle frequency gain and a high frequency gain, b) reading the middle frequency gain of the selected frequency characteristic curve and if the logarithmic middle frequency gain is essentially different of zero and negative, c) reducing the volume gain departing from a volume level set by the user until the actual middle frequency gain substantially matches with the middle frequency gain of the selected frequency characteristic curve, d) adjusting the low frequency gain to substantially match with the low frequency gain of the selected frequency characteristic curve and e) adjusting the high frequency gain to substantially match with the high frequency gain of the selected frequency characteristic curve.

This method is applicable if the middle frequency gain in dB is negative. In case this gain value in dB is greater than 0 dB the invention provides an alternative method. This method comprises the steps of:

a) selecting a frequency characteristic curve having attributed a low frequency gain, a middle frequency gain and a high frequency gain, b) reading the middle frequency gain of the selected frequency characteristic curve and if the logarithmic middle frequency gain (log $[G_{mid}]$) is essentially different of zero and positive, c) increasing the volume gain departing from a volume level set by the user until the actual middle frequency gain substantially matches with the middle frequency gain of the selected frequency characteristic curve, d) adjusting the low frequency gain to substantially match with the low frequency gain of the selected frequency characteristic curve and e) adjusting the high frequency gain to substantially match with the high frequency gain of the selected frequency characteristic curve.

In an advantageous variant of the inventive methods the adjusted low and high frequency gains are monitored and compared with an allowed range of gains of the audio processor. In this way it is secured that the audio processor is not operated under overload conditions.

It is therefore convenient to re-adjust the volume gain if the low and/or high frequency gains have departed from the allowed range of gains to establish good conditions for sound reproduction.

According to a second aspect of the invention it is desirable to provide an electronic device being equipped with a two band audio processor, which is adjusted by a method according to the invention.

The invention will be more fully understood by reading the following description accompanied by a drawing. In the drawing an exemplary embodiment of the present invention is illustrated.

FIG. 1 shows a block diagram of an audio device equipped with a digital audio processor;

FIG. 2 visualizes different types of frequency response curves,

Figure 5:
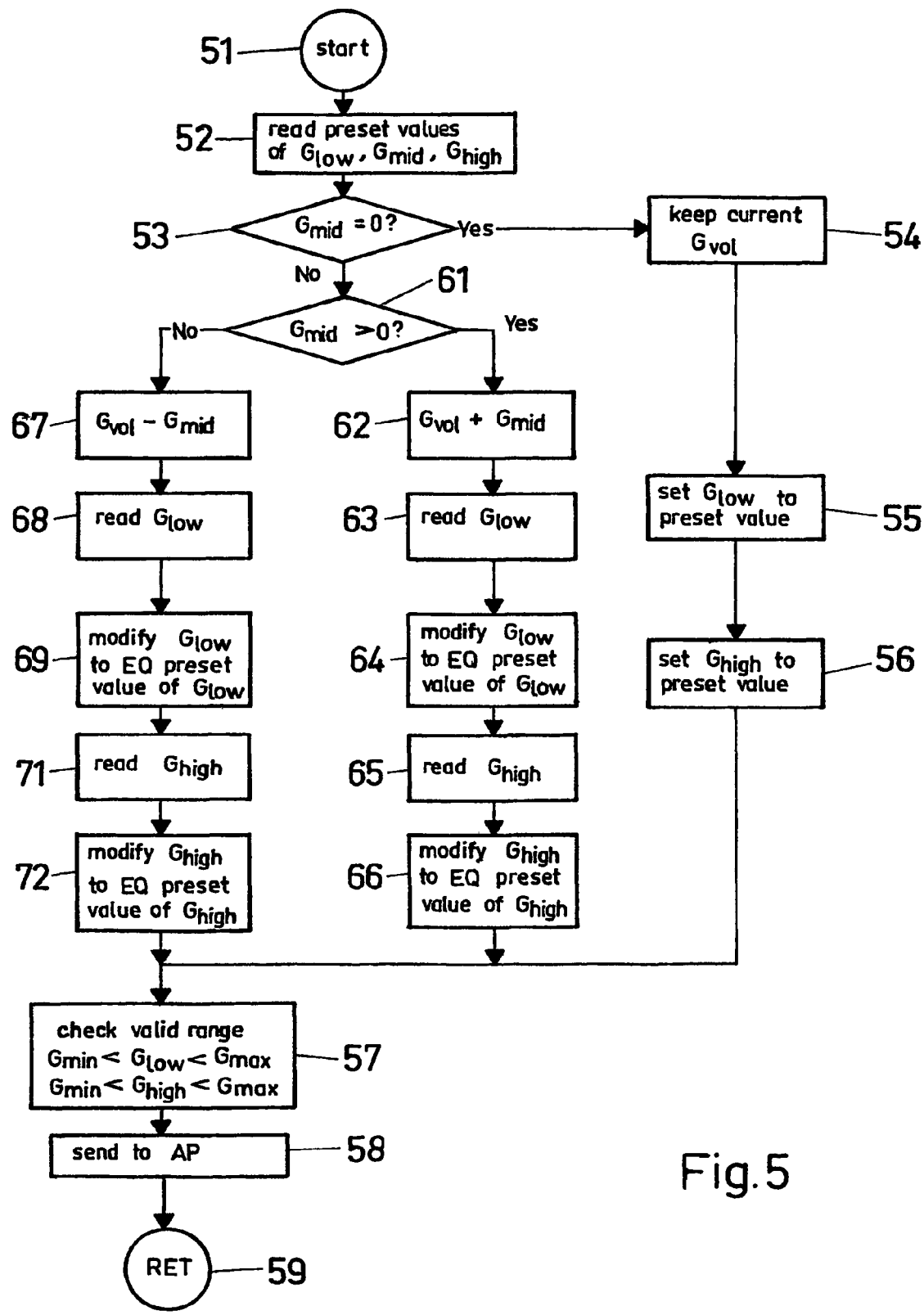

FIG. 5 exhibits the program flow of a software program based on the present invention.

Figure 1:
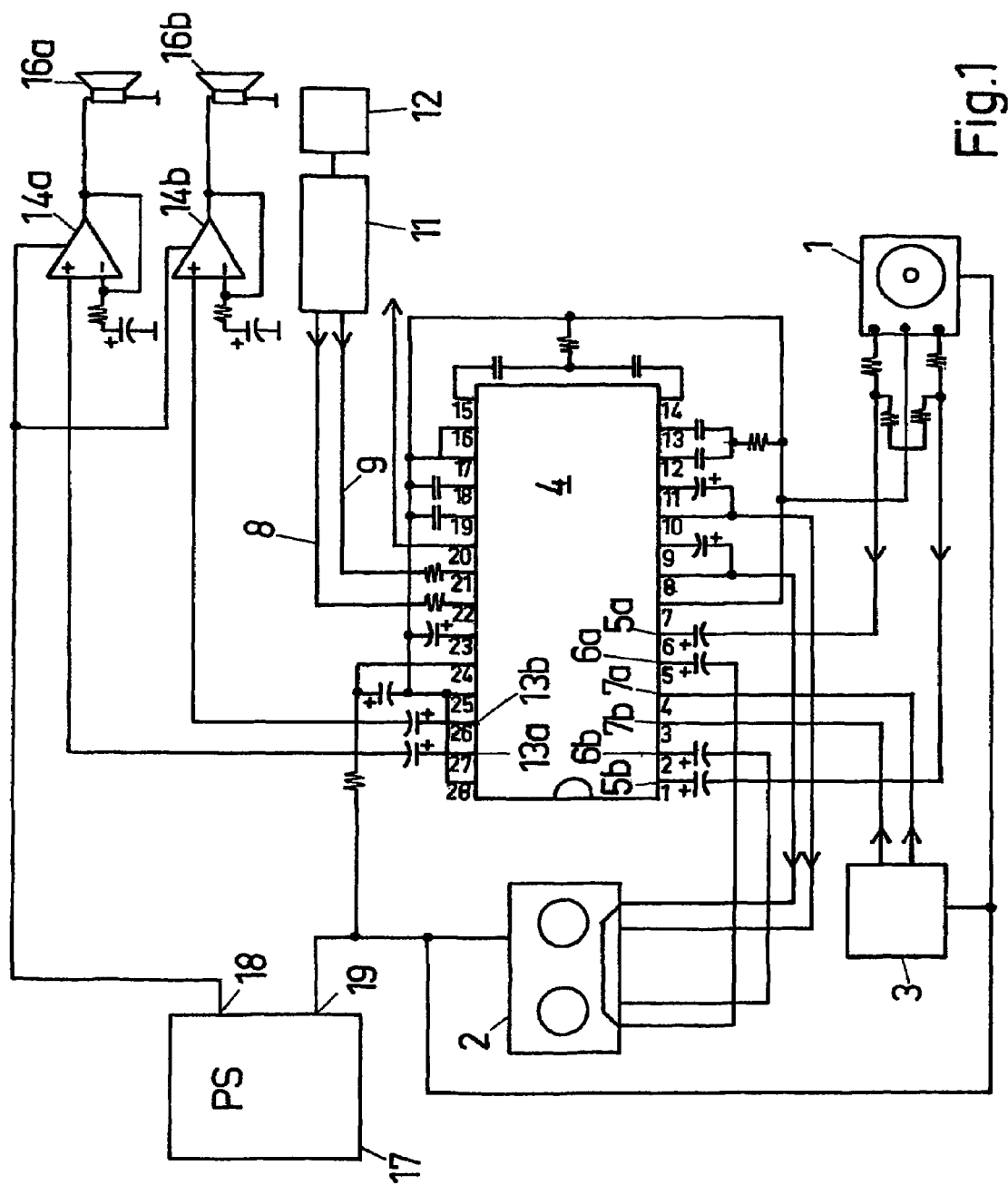

FIG. 1 shows a schematic block diagram of an audio device adapted for stereo representation of audio signals. In the described embodiment of the invention, the audio device is a portable audio device being equipped with a CD player module 1, a cassette player module 2 and a tuner/demodulator module 3 for receiving broadcastings. All modules 1, 2 and 3 provide the audio signals on two channels for stereo reproduction. Even though the description of the present invention relates to a portable audio device, the invention is not limited thereto. In fact, the invention is applicable to any device reproducing or generating base band audio signals, which are to be transformed into sound waves. It is also noted that the processing of audio signals to produce the base band audio signals and the transformation of the base bands audio signals into sound waves do not have to take place in one single device but also can be separated between several devices e.g. in a modular stereo equipment.

The audio signals provided by the input modules 1, 2, 3 are transferred to a digital audio processor 4 receiving the input signals at three pairs of inputs 6a, 6b; 7a, 7b and 5a, 5b. The audio processor can be of the type TDA 7440D manufactured by ST microelectronics. The audio processor 4 is connected via data lines 8, 9 to a microcomputer 11 In the present embodiment the data lines 8, 9 transmit data according to the well-known Lsup.2C standard. The microcomputer 11 receives input commands from a user command-processing unit 12. The commands are inputted by a user into a control panel or a remote control. The reception and processing of the user commands is conventional and therefore not described in detail. When the microcomputer 11 receives a user command e.g. a certain volume level, it transmits a corresponding data word to the audio processor 4. In the present example the microcomputer transmits a data word to the audio processor 4 to select an appropriate volume gain G.sub.vol. In the following the term "volume gain" will be used for a frequency independent gain factor amplifying the audio signal. In addition to that, the audio signals are selectively amplified in the high and low frequency range corresponding to a characteristic frequency response curve, which will be explained below. The audio processor 4 provides the amplified audio signals at outputs 13a and 13b, which are connected to, amplifier stages 14a and 14b. The amplifiers 14a and 14b are connected to loudspeakers 16a and 16b, which are driven by the amplifiers to generate sound waves.

A power supply 17 supplies at output 18 DC electrical power to the amplifiers 14a and 14b. The power supply 17 also supplies DC electrical power at output 19 to the electronic signal processing circuitry as well as to the input modules 1, 2, and 3. The supply voltage at output 18 is higher than that at output 19 to reduce power dissipation. Typical values are 10 V and 7 V supply voltage, respectively.

Figure 2:
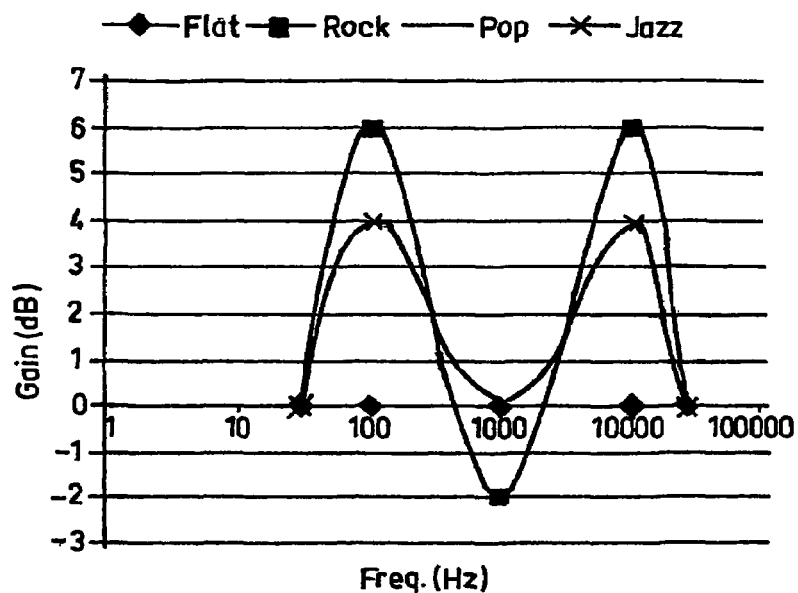

The microcomputer 11 allows selecting a specific frequency response curve out of a group of such curves, which are stored in the memory of the microcomputer. FIG. 2 shows typical examples of different frequency response curves, which are labelled "flat", "rock", "pop" and "jazz". As can be taken from FIG. 2, a gain value at 0.1 kHz, 1 kHz, and 10 kHz define the different frequency response curves. Adjusting the frequency gain in the low, middle, and high frequency range changes the sound characteristic of the audio device independently of the volume level i.e. of the volume gain, which is constant versus the frequency of the audio signal. The frequency gain in the low, middle and high frequency range are designated in the following as $G_{low}$, $G_{mid}$ and $G_{high}$, respectively.

Figure 3A:
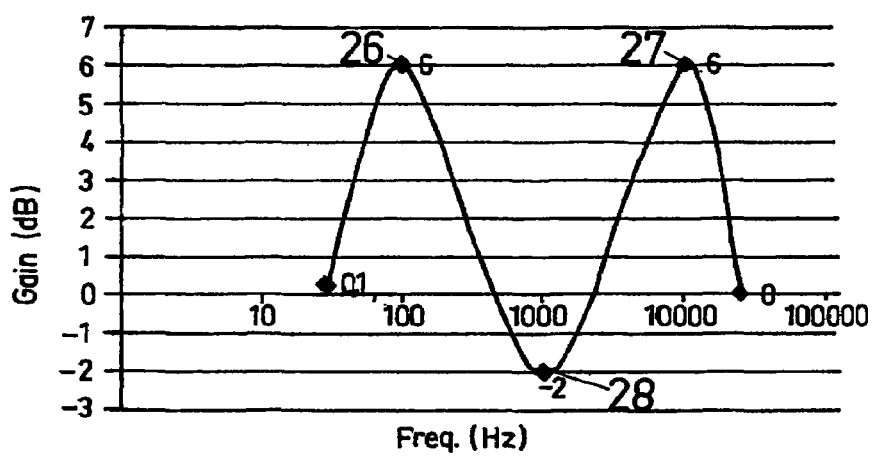
FIG. 3a shows an exemplary frequency response curve of a 3-band audio processor.

It is very convenient to adapt the characteristic of the audio device by utilizing a so-called 3-band audio processor. The properties of this type of processor are illustrated in FIG. 3a. A 3-band audio processor allows adjusting the gain selectively and independently in the low, middle, and high frequency range. In the example shown in FIG. 3a 0.1 kHz, 1 kHz and 10 kHz are chosen as low, middle and high frequency. In other words the frequency gain at points 26, 27, and 28 on the graph in FIG. 3a can be shifted up and down individually according to the characteristic frequency response curve selected by the user.

Figure 3B:
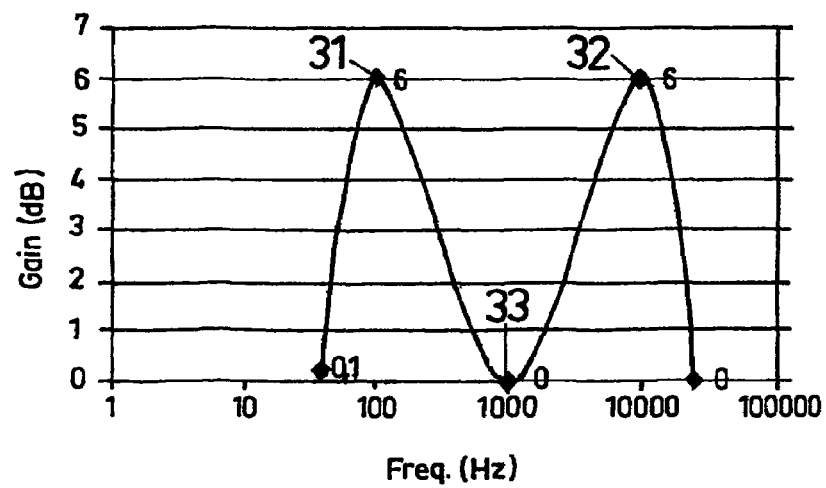
FIG. 3b shows an exemplary frequency response curve of a 2-band audio processor.

Correspondingly, a 2-band audio processor only allows selecting the gain at low and high frequencies, which are for example selected to be 0.1 kHz and 10 kHz. The difference between a 2-band audio processor and a 3-band audio processor becomes apparent when comparing FIGS. 3a and 3b: The 2-band audio processor only allows shifting the points 31 and 32 in the graph of FIG. 3b, whereas point 33 in the middle frequency range at 1 kHz always remains at a gain level of 0 dB. Consequently, it is not possible to realise the frequency response curves 22 and 23 shown in FIG. 2 and labelled as "rock" and "pop", respectively. It is only possible to adapt the audio processor to frequency response curves having a middle frequency gain of 0 dB.

Figure 4:
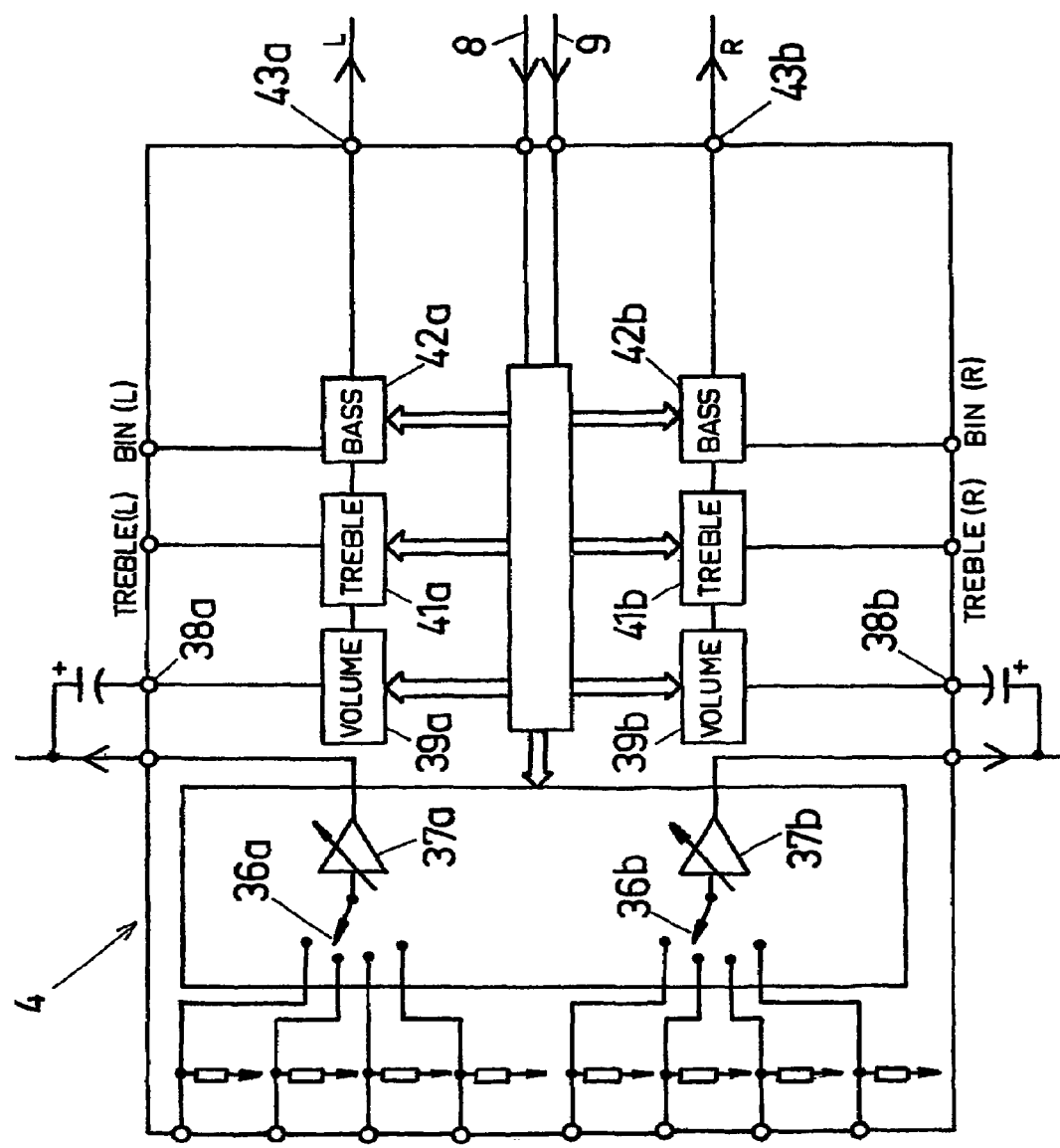
FIG. 4 shows a block diagram of a 2-band audio processor.

In order to explain the functionality of a 2-band audio processor in more detail FIG. 4 displays a schematic diagram of an exemplary 2-band audio processor.

The 2-band audio processor 4 shown in FIG. 4 receives data words sent out by the microcomputer 11 via the data lines 8 and 9. The data lines 8 and 9 preferably represent a serial I²C bus between the audio processor and the microcomputer 11. The audio processor 4 decodes the received commands and controls different internal sections being operative for different functions. The audio processor 4 is provided with four pairs of inputs for receiving audio signals, which can be selected individually by multiplexers 36a, 36b. The multiplexers incorporate also two amplifiers 37a, 37b for the left and the right channel. The output signals of the amplifiers 37a and 37b are coupled to inputs 38a and 38b. At the same time the signals can also be used for recordings performed by the cassette recorder module 2. The signal is then provided to a volume amplifier 39a, 39b amplifying the input signal independent of its frequency. Subsequently, the output signal of the volume amplifier is provided to a treble amplifier 41a, 41b amplifying only in the high frequency range. The output of the treble amplifier is provided to a bass amplifier 42a, 42b amplifying only in the low frequency range. The signal amplified according to the frequency characteristic curve is then supplied to the output pins 43a and 43b. These signals represent the input signals for the amplifier stages 14a, 14b (FIG. 1).

The method according to the present invention allows using a 2-band audio processor that still permits to realize a frequency response curve having a gain value at a middle frequency range which is different from 0 dB such that the characteristic frequency response curves labelled as "rock" or "pop" in FIG. 2 can be realized. How this is done in detail will be explained by means on the flow diagram illustrated in FIG. 5.

FIG. 5 shows a flow diagram of software program, which is executed every time the audio devices switched on and every time a mode selector switch or something similar is actuated (step 51). The microcomputer 11 reads the current selection of the frequency characteristic curve from the user command input unit 12. Then, the microcomputer loads the data corresponding to the user selection from its associated memory into its working memory (step 52). In the described embodiment the data include the preset values of the low, middle and high frequency gain, i.e. $G_{low}$, $G_{mid}$ and $G_{high}$.

In the following it is important to distinguish between the preset gain values and variable gain values, which are modified by the described method. Both sets of values are stored in different memory locations. E.g. if the volume gain is increased the variable gain values are affected whereas the preset gain values remain constant.

The microcomputer decides if the $G_{mid}$ value equals to 0 (step 53). If this is the case, then the currently adjusted volume gain $G_{vol}$ is kept constant (step 54) and the low frequency gain $G_{low}$ and high frequency gain $G_{high}$ are set to their respective preset values (step 55, 56). Subsequently, it is checked it the selected values are within a range of values between $G_{min}$ and $G_{max}$, which is allowed by the audio processor 4 (step 57). If both values are within the allowed range the data are sent to the audio processor (step 58) via the data lines 8, 9 (FIG. 1) and the program is terminated (step 59). If one of $G_{low}$ and $G_{high}$ (or both) is outside the allowed range the concerned value is incremented or decremented until it falls within the allowed range. Only then, the adjusted gain values $G_{low}$ and $G_{high}$ are sent to the audio processor.

The above described case is trivial because it does not present any difficulties to adjust a characteristic frequency response curve with a 2-band audio processor as long as the gain value for the middle frequency range $G_{mid}$ equals to 0 dB. The more complicated situation is when the result of the decision in step 53 is "no", i.e. the $G_{mid}$ value is not 0 dB. Then it becomes necessary to distinguish two cases (step 61).

Firstly, the situation when the God value is greater than 0 dB will be considered. In this case the decision in step 61 is "yes". In this case the volume gain $G_{vol}$ is increased by the $G_{mid}$ value (step 62). Then, the $G_{low}$ value is read (step 63) and modified such that it matches with the preset $G_{low}$ value of the selected frequency response curve (step 64). Normally, a reduction of the $G_{low}$ value will be necessary. However, it is also possible that the $G_{low}$ value has still to be increased when a frequency response curve with bass boost is selected.

The last two steps are correspondingly repeated for the high frequency gain $G_{high}$ to match it with the predetermined $G_{high}$ value of the selected frequency response curve (step 65, 66). After completion of this step it is again checked whether the adjusted values for $G_{low}$ and $G_{high}$ are within an allowed range of values (step 57) before the data are sent to the audio processor (step 58) and the program is terminated (step 59).

Secondly, the case when the $G_{mid}$ value is smaller than 0 dB is considered, i.e. the decision in step 61 is "no". In this case, the volume gain $G_{vol}$ is reduced by the preset $G_{mid}$ value (step 67). Then, the $G_{low}$ value is read (step 68) and then modified until it matches with the preset $G_{low}$ value of the selected frequency response curve (step 69). The last two steps are repeated in a corresponding way for the high frequency gain value $G_{high}$ (step 71, 72). Also in this program part the adjusted $G_{low}$ and $G_{high}$ values are checked to be in an allowable range of the audio processor (step 57) before they are sent to the audio processor (step 58) and the program is terminated (step 59).

After the volume gain $G_{vol}$ has been adjusted by the microcomputer 11 such that a selected characteristic frequency response curve can be matched, the user may increase or decrease again the volume gain to hear the reproduced music at a desired volume level.

In essence, the described method is based on the adjustment of the volume gain, the low frequency gain $G_{low}$ and the high frequency gain $G_{high}$ in order to simulate with a 2-band audio processor the adjustment possibilities of a 3-band audio processor.

The invention claimed is:

1. Method for adjusting the frequency characteristic of a digital audio processor having adjustable parameters including at least a low frequency gain, a high frequency gain and a volume gain, the method comprising the steps of:
   a) selecting a frequency characteristic curve having attributed a low frequency gain, a middle frequency gain and a high frequency gain,
   b) reading the middle frequency gain of the selected frequency characteristic curve and if a logarithmic of middle frequency gain of the selected frequency characteristic curve is essentially below zero,
      i) reducing the volume gain departing from a volume level set by the user until the actual middle frequency gain substantially matches with the middle frequency gain of the selected frequency characteristic curve,
      ii) adjusting the actual low frequency gain to substantially match with the low frequency gain of the selected frequency characteristic curve and
      iii) adjusting the actual high frequency gain to substantially match with the high frequency gain of the selected frequency characteristic curve.

2. Method according to claim 1, wherein the adjusted low, and high frequency gains are monitored and compared with an allowed range of gains.

3. Method according to claim 2, wherein if the low and/or high frequency gains have departed from the allowed range of gains, the volume gain is re-adjusted such that the low and/or high frequency gains are inside the allowed range of gains.

4. Method for adjusting the frequency characteristic of a digital audio processor having adjustable parameters including at least a low frequency gain, a high frequency gain and a volume gain, the method comprising the steps of:
   a) selecting a frequency characteristic curve having attributed a low frequency gain, a middle frequency gain and a high frequency gain,
   b) reading the middle frequency gain of the selected frequency characteristic curve and if a logarithmic of middle frequency gain of the selected frequency characteristic curve is essentially above zero,
      i) increasing the volume gain departing from a volume level set by the user until the actual middle frequency gain substantially matches with the middle frequency gain of the selected frequency characteristic curve,
      ii) adjusting the actual low frequency gain to substantially match with the low frequency gain of the selected frequency characteristic curve and
      iii) adjusting the actual high frequency gain to substantially match with the high frequency gain of the selected frequency characteristic curve.

5. Apparatus for adjusting the frequency characteristic of a digital audio processor having adjustable parameters comprising at least a low frequency gain, a high frequency gain and a volume gain, comprising:
   means for selecting a frequency characteristic curve having attributed a low frequency gain, a middle frequency gain and a high frequency gain;
   means for reading the middle frequency gain of the selected frequency characteristic curve;
   means for reducing the volume gain departing from a volume level set by the user until the actual middle frequency gain matches with the middle frequency gain of the selected frequency characteristic curve if a logarithm of middle frequency gain of the selected frequency characteristic curve is essentially below zero; and
   means for adjusting the actual low frequency gain to match with the low frequency gain of the selected frequency characteristic curve and the actual high frequency gain to match with the high frequency gain of the selected frequency characteristic curve.

6. Apparatus according to claim 5, wherein it further comprises means for monitoring and comparing the adjusted low, and high frequency gains with an allowed range of gains.

7. Apparatus for adjusting the frequency characteristic of a digital audio processor having adjustable parameters comprising at least a low frequency gain, a high frequency gain and a volume gain, comprising:
   means for selecting a frequency characteristic curve having attributed a low frequency gain, a middle frequency gain and a high frequency gain;
   means for reading the middle frequency gain of the selected frequency characteristic curve;
   means for increasing the volume gain departing from a volume level set by the user until the actual middle frequency gain matches with the middle frequency gain of the selected frequency characteristic curve if a logarithm of middle frequency gain of the selected frequency characteristic curve is essentially above zero; and
   means for adjusting the actual low frequency gain to match with the low frequency gain of the selected frequency characteristic curve and the actual high frequency gain to match with the high frequency gain of the selected frequency characteristic curve.

8. Apparatus according to claim 7, wherein it further comprises means for monitoring and comparing the adjusted low, and high frequency gains with an allowed range of gains.

9. Apparatus according to claim 7, wherein if the low and/or high frequency gains have departed from the allowed range of gains, the volume gain is re-adjusted such that the low and/or high frequency gains are inside the allowed range of gains.

* * * * *